(12) United States Patent
Kim et al.

(10) Patent No.: US 8,228,057 B2
(45) Date of Patent: Jul. 24, 2012

(54) SWIVEL PORTABLE TERMINAL

(75) Inventors: Hyun-Seok Kim, Suwon-si (KR);
In-Kook Yoon, Suwon-si (KR);
Young-Chul Shin, Seoul (KR);
Jae-Woong Jeon, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 363 days.

(21) Appl. No.: 11/958,878

(22) Filed: Dec. 18, 2007

(65) Prior Publication Data

US 2008/0157754 A1 Jul. 3, 2008

(30) Foreign Application Priority Data

Dec. 28, 2006 (KR) .................. 10-2006-0135892

(51) Int. Cl.
*G01B 7/14* (2006.01)

(52) U.S. Cl. ............... 324/207.2; 455/575.3; 455/575.1; 455/550.1

(58) Field of Classification Search .... 455/575.1–575.9, 455/456.5, 456.6, 550.1, 554.2, 575.1–575.9; 324/207.2–207.26; 73/514.31, 514.39, 514.16, 73/862.333, 862.779; 340/546–547, 549; D14/316, 377–379
See application file for complete search history.

(56) References Cited

U.S. PATENT DOCUMENTS

| | | | | |
|---|---|---|---|---|
| 5,670,877 A * | 9/1997 | Scheiber | ................ | 324/207.25 |
| 6,271,663 B1 * | 8/2001 | Kanbe et al. | ............ | 324/207.21 |
| 6,549,789 B1 * | 4/2003 | Kfoury | ................ | 455/550.1 |
| 6,628,974 B1 * | 9/2003 | Lim | ................ | 455/575.3 |
| 7,174,195 B2 * | 2/2007 | Nagamine | ................ | 455/575.1 |
| 7,233,139 B2 * | 6/2007 | Kitanaka et al. | ......... | 324/207.12 |
| 7,277,086 B2 * | 10/2007 | Sugihara | ................ | 345/169 |
| 7,502,636 B2 * | 3/2009 | Sakuta et al. | ............ | 455/575.1 |
| 7,505,797 B2 * | 3/2009 | Kim | ................ | 455/575.1 |
| 7,610,684 B2 * | 11/2009 | Steinich | ................ | 33/1 PT |
| 7,738,656 B2 * | 6/2010 | Yoda | ................ | 379/433.01 |
| 2003/0064758 A1 * | 4/2003 | Mizuta et al. | ............ | 455/566 |
| 2003/0231243 A1 * | 12/2003 | Shibutani | ............ | 348/207.99 |
| 2004/0185920 A1 * | 9/2004 | Choi et al. | ............ | 455/575.1 |
| 2005/0079897 A1 * | 4/2005 | Nishijima et al. | ......... | 455/575.1 |
| 2005/0207104 A1 * | 9/2005 | Love | ................ | 361/683 |
| 2005/0239519 A1 * | 10/2005 | Saitou et al. | ............ | 455/575.1 |

(Continued)

FOREIGN PATENT DOCUMENTS

JP 2000022790 A * 1/2000

(Continued)

OTHER PUBLICATIONS

Princeton University definition for swivel.*

*Primary Examiner* — Kent Chang
*Assistant Examiner* — Ronald Eisner
(74) *Attorney, Agent, or Firm* — The Farrell Law Firm, P.C.

(57) ABSTRACT

Provided is a swivel portable terminal. The swivel portable terminal is configured to allow first and second magnet detecting units installed at one body of a main body and a swivel body at a predetermined interval therebetween to detect first and second magnets installed at the other body and corresponding to the first and second magnet detecting units. A rotation direction in which the swivel body rotates is determined according to a time difference of a change in a magnet detecting state of the first and second magnet detecting units when the swivel body rotates.

18 Claims, 7 Drawing Sheets

U.S. PATENT DOCUMENTS

| | | | |
|---|---|---|---|
| 2005/0239522 A1* | 10/2005 | Ting | 455/575.3 |
| 2005/0272462 A1* | 12/2005 | Okamoto | 455/550.1 |
| 2006/0261804 A1* | 11/2006 | Itoh et al. | 324/207.25 |
| 2006/0275031 A1* | 12/2006 | Ku et al. | 396/429 |
| 2006/0285678 A1* | 12/2006 | Ota | 379/433.01 |
| 2007/0180890 A1* | 8/2007 | Steinich | 73/11.01 |
| 2007/0188380 A1* | 8/2007 | Duong et al. | 342/374 |
| 2008/0014987 A1* | 1/2008 | Kusuda et al. | 455/556.1 |
| 2008/0018542 A1* | 1/2008 | Yamazaki et al. | 343/702 |
| 2008/0048654 A1* | 2/2008 | Takahashi et al. | 324/207.25 |
| 2008/0157754 A1* | 7/2008 | Kim et al. | 324/207.2 |
| 2008/0231602 A1* | 9/2008 | Kusuda et al. | 345/168 |

FOREIGN PATENT DOCUMENTS

| | | |
|---|---|---|
| KR | 1020060006298 | 1/2006 |
| KR | 1020060026493 | 3/2006 |

* cited by examiner

SWIVEL PORTABLE TERMINAL

PRIORITY

This application claims priority under 35 U.S.C. §119 to an application filed in the Korean Intellectual Property Office on Dec. 28, 2006 and assigned Serial No. 2006-135892, the contents of which are incorporated herein by reference.

BACKGROUND OF THE INVENTION

1. Field of the Invention

The present invention relates generally to a swivel portable terminal, and in particular, to a swivel portable terminal including a device for detecting a rotation direction of a swivel body by applying a proper application on the terminal according to a rotation direction of the swivel body, and a method for detecting a rotation direction of a swivel body using the same.

2. Description of the Related Art

Rapid development of the Information Technology industry has lead to development of portable terminals to the point where more than one terminal being used per capita have been recorded in certain regions. Terminal users are demanding smaller and lighter terminals offering more functions. In response, besides a basic communication function, the portable terminals are being equipped with various additional functions such as replaying music with high sound quality through an MP3 player, providing a multimedia broadcasting service through a Digital Multimedia Broadcast (DMB) module, or capturing an object and performing video communications through a high-quality Liquid Crystal Display (LCD) module and a camera lens assembly. Therefore, terminal providers are making efforts to integrate a plurality of individual modules within a single terminal, so that the terminals operate in various manners, and offer various functions.

Operationally, the portable terminal has evolved from an early bar type to a flip type, a folder type, and a slide type. Among those, the folder type terminal and the slide type terminal are being mainly used these days.

Besides the aforementioned types of terminals, terminals with sub-bodies operating in various manners are being released. A representative example of those terminals is one that includes a sub-body swinging around a predetermined axis. The terminal with the swinging sub-body allows convenient use of a desired function by, for example, rotating in a width direction an LCD module which is longitudinally disposed, or rotating the LCD module 90° or 180° around a length direction of the terminal. This type of terminal is called a 'swivel terminal.'

Since the swivel type terminal is configured such that the sub-body is rotatable 90 or 180° with respect to a main body, the terminal can perform different functions according to its rotation direction.

FIG. 1 is a perspective view of a typical folder-type swivel portable terminal 100, and FIG. 2 is a perspective view illustrating rotation of a swivel body 120 of the typical folder-type swivel portable terminal 100 of FIG. 1. The swivel body 120 can be folded with respect to a main body 110, and can rotate around a length direction of the terminal 100. However, the folder type terminal in the description is merely an example, and the present invention may be applied to other types of terminals including swivel sub-bodies, such as a bar-type terminal, and a slide type terminal.

As illustrated in FIGS. 1 and 2, the typical folder-type swivel portable terminal 100 includes the main body 110, and the swivel body 120 foldable with respect to the main body 110.

The main body 110 includes a plurality of key buttons 111 as a data input unit, and a microphone unit 112 installed at a lower end thereof. The swivel body 120 includes a LCD module 121, a display device, on a surface facing the main body 110, and a speaker unit 122 at an upper end thereof. The main body 110 and the swivel body 120 are connected together by a predetermined swivel hinge module 10. The swivel hinge module 10 may be installed in both side hinge arms 113 and 114 installed at the main body, and a center hinge arm 13 interposed between the side hinge arms 113 and 114. The center hinge arm 13 may serve the same function as a fixed body (13 of FIG. 3) to be described later according to the present invention.

The folder type terminal 100 may include both a hinge module (not shown) for folding the swivel body 120, and the swivel hinge module 10 for swinging the swivel body 120 within the side hinge arms 113 and 114, and the center hinge arm 13.

Thus, the swivel body 120 can be folded with respect to the main body by pivoting on axis A as illustrated in FIG. 1, and can be rotated on an x-axis as illustrated in FIG. 2.

For example, the swivel body 120 can rotate clockwise or counterclockwise around the x-axis, and the rotation angle thereof may be 90° or 180°. If a camera lens module (not shown) is installed at a side surface of one of the side hinge arms 113 and 114, the swivel body 120 can be used in an image capturing mode, or a video communication mode according to a rotation direction in which the swivel body 120 rotates. For example, in order to use the image capturing mode, the swivel body must be rotated to be in an opposite direction to the camera lens assembly, while in the video communication mode, the swivel body 120 must be rotated to be in the same direction as the camera lens assembly.

However, the swivel portable terminal causes difficulties in use since a corresponding function is selected after the terminal has rotated due to the absence of a device for detecting the rotation direction in which the swivel body rotates.

SUMMARY OF THE INVENTION

An aspect of the present invention is to substantially solve at least the above problems and/or disadvantages and to provide at least the advantages below. Accordingly, an aspect of the present invention is to provide a swivel portable terminal including a device for detecting a rotation direction of a swivel body, which is configured to maximize convenience in use of the terminal with only a simple structure, and a method for detecting a rotation direction of a swivel body using the same.

Another aspect of the present invention is to provide a swivel portable terminal including a device for detecting a rotation direction of a swivel body, which is configured to perform its function with a simple structure and a low-cost component, and a method for detecting a rotation direction of a swivel body using the same.

According to one aspect of the present invention, a swivel portable terminal includes a main body; a swivel body rotating a predetermined angle around a predetermined axis with respect to the main body; a pair of magnets installed at one body of the main body and the swivel body, and having a predetermined interval therebetween; a pair of magnet detecting units installed at the other body of the main body and the swivel body, the magnet detecting units corresponding to the respective magnets; and a control unit receiving signals detected by the magnet detecting units according to rotation of the swivel body to determine a rotation direction in which the swivel body rotates, and controlling a function of the terminal corresponding to the rotation direction.

A detection device according to the present invention may be disposed at a rotary body and a fixed body that connect the main body and the swivel body with each other. Thus, according to another aspect of the present invention, a swivel portable terminal includes a main body including a predetermined fixed body; a swivel body rotatably installed at the fixed body and including a predetermined rotary body; a pair of magnets installed at one body of the fixed body and the rotary body, and having a predetermined interval therebetween; a pair of magnet detecting units installed at the other body of the main body and the swivel body, the magnet detecting units corresponding to the respective magnets; and a control unit receiving signals detected by the respective magnet detecting units according to rotation of the swivel body to determine a rotation direction in which the swivel body rotates, and controlling a function of the terminal corresponding to the determined rotation direction.

According to still another aspect of the present invention, a method for detecting a rotation direction in which a swivel body of a swivel portable terminal configured to allow first and second magnet detecting units installed at one body of a main body and a swivel body at a predetermined interval therebetween to detect first and second magnets installed at the other body of the main body and the swivel body and corresponding to the first and second magnet detecting units, the method includes determining a rotation direction in which the swivel body rotates according to a time difference of a change in a magnet detecting state of the first and second magnet detecting units when the swivel body rotates, the magnet detecting state being changed according to a change in relative positions between the first and second magnets and the first and second magnet detecting units.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail for clarity and conciseness.

Figure 1:
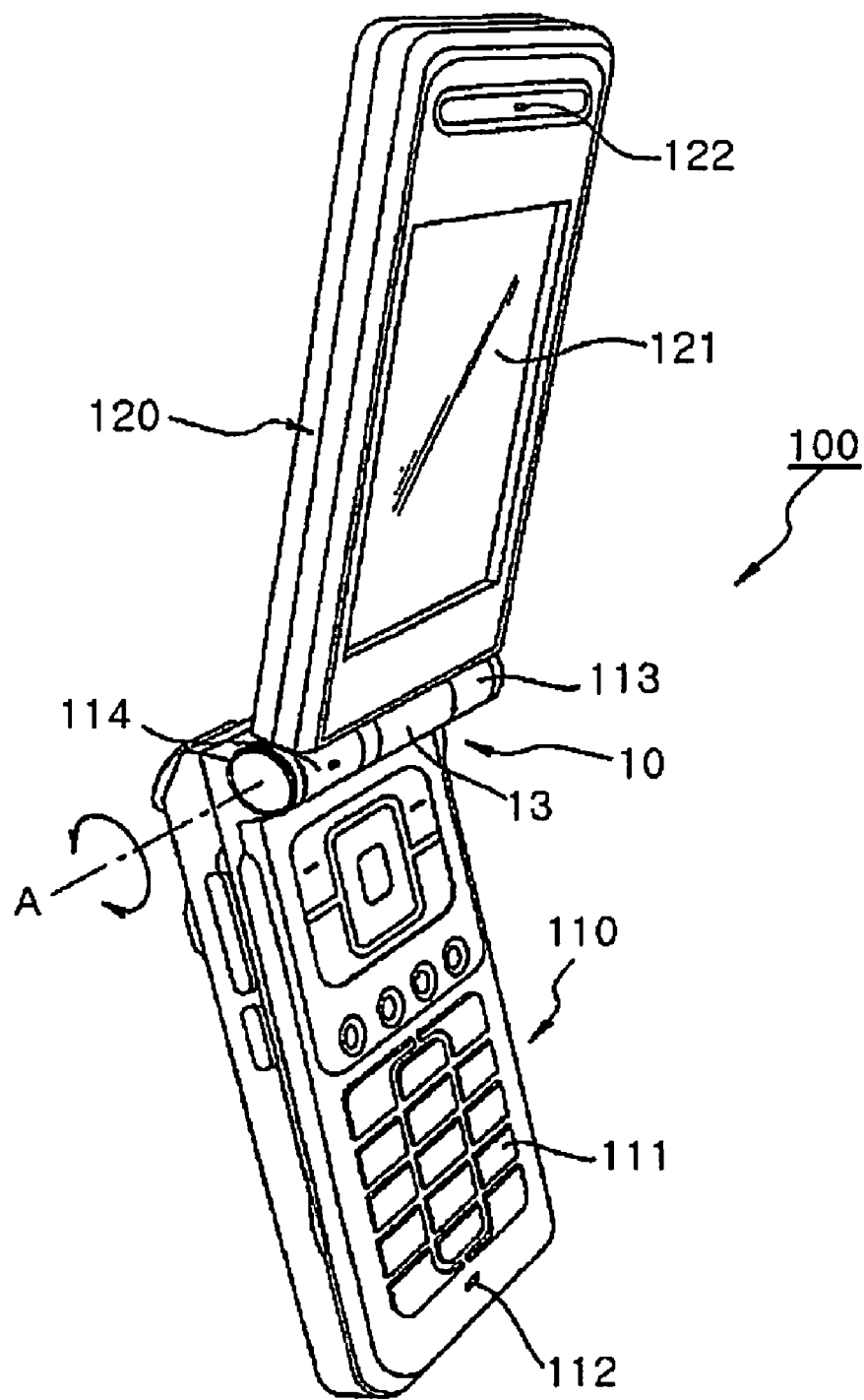
FIG. 1 is a perspective view of a typical swivel portable terminal.
Figure 2:
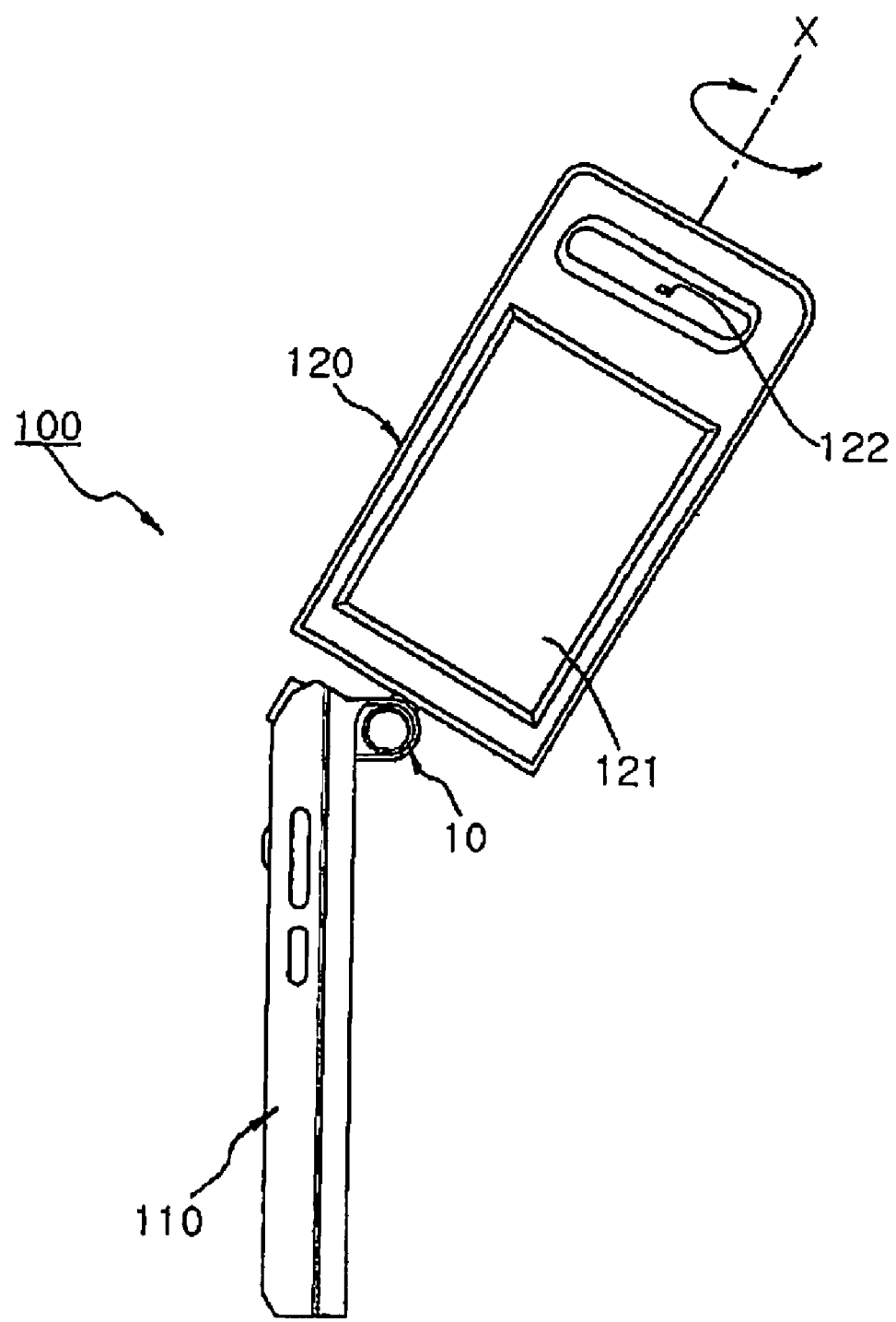
FIG. 2 is a perspective view illustrating rotation of a swivel body of the typical swivel portable terminal of FIG. 1.

Although a folder type portable terminal performing both folding and swiveling operations is illustrated and described with reference to FIGS. 1 and 2, the present invention is not limited thereto. For example, the present invention is applicable to various types of terminals including swivel bodies rotating with respect to main bodies.

In describing the present invention, the same components as those illustrated in FIGS. 1 and 2 will not be further mentioned, and the description will be made from a swivel hinge module applied to both side hinge arms of a main body, and a center hinge arm of a swivel body.

Figure 3:
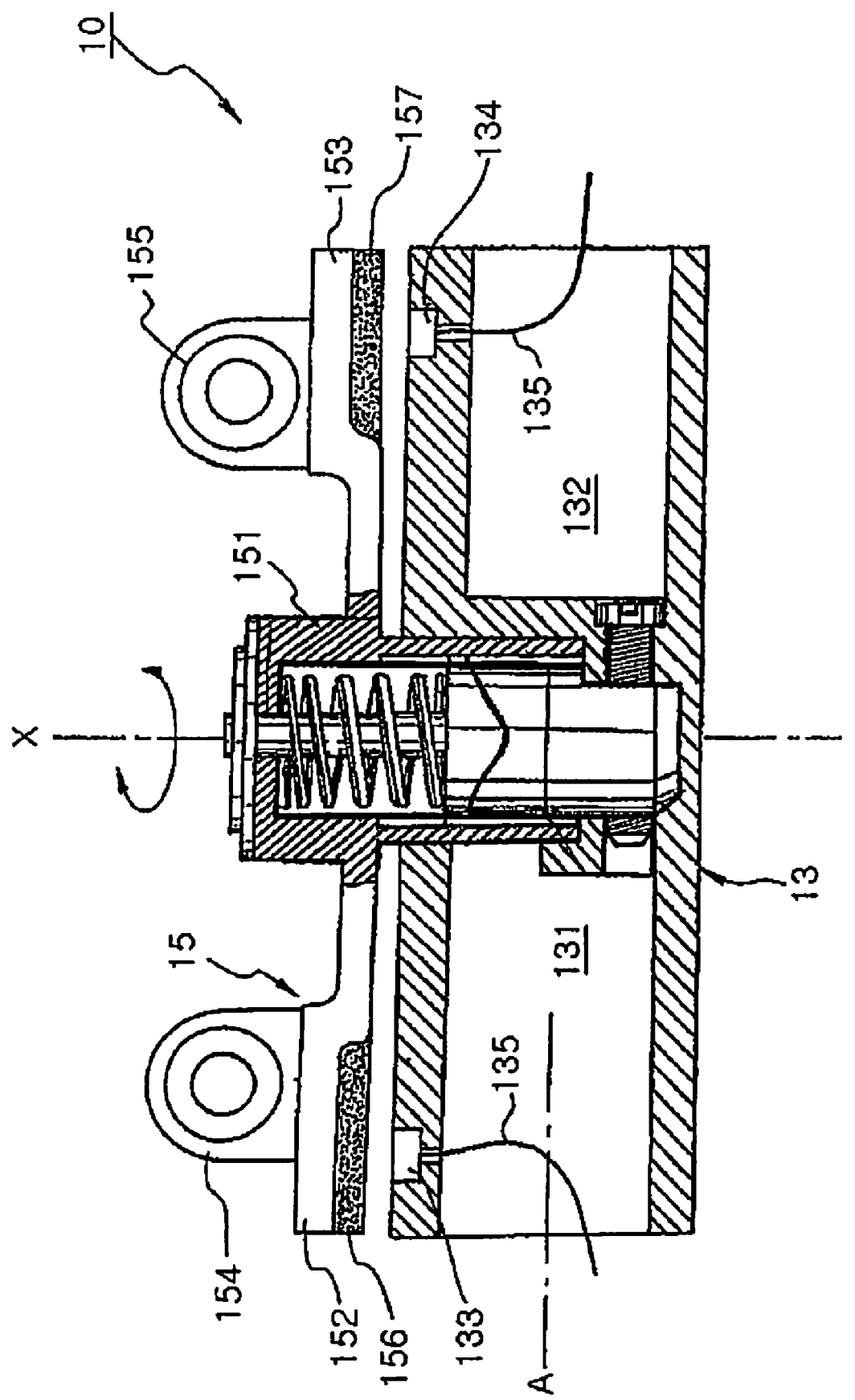
FIG. 3 is a sectional view illustrating a main part of a swivel hinge module where a device for detecting a rotation direction is installed according to the present invention.
Figure 4:
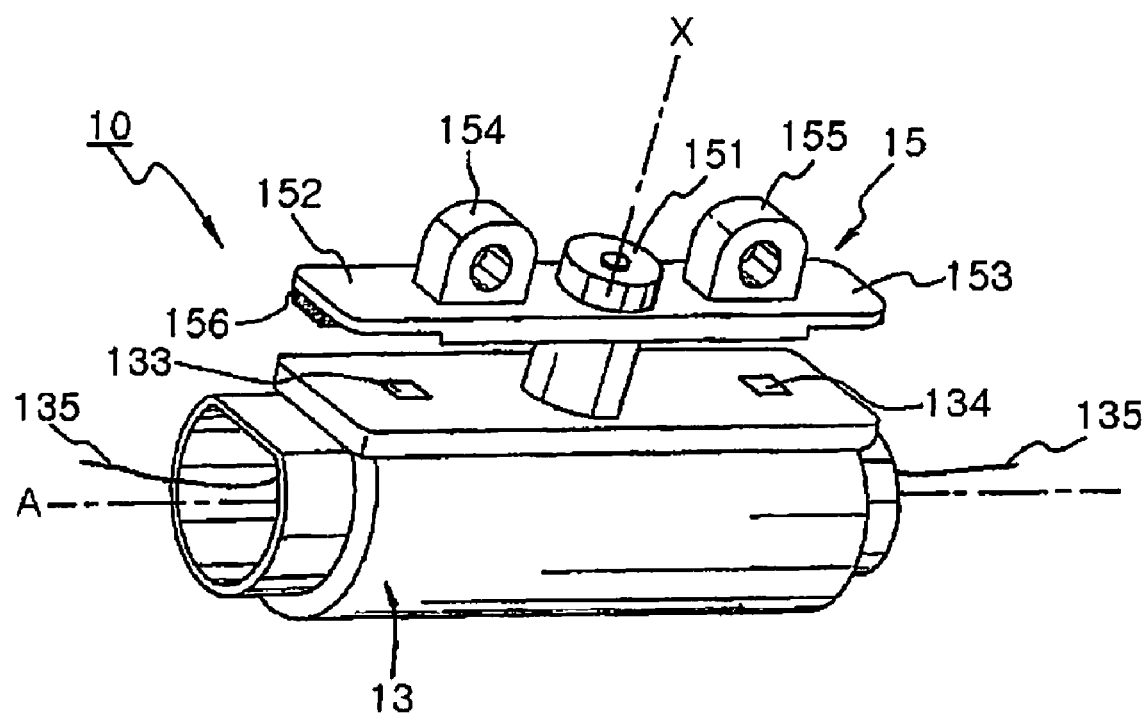
FIG. 4 is a perspective view of the swivel hinge module of FIG. 3 according to the present invention.

FIG. 3 is a sectional view illustrating a main part of a swivel hinge module where a device for detecting a rotation direction is installed according to the present invention, and FIG. 4 is a perspective view of the swivel hinge module of FIG. 3.

The swivel hinge module 10 according to the present invention includes a fixed body 13 installed at a main body 110, and a rotary body 15 rotatably coupled to the fixed body 13.

The fixed body 13 is a component of the main body 110. The fixed body 13 may be constructed integrally with the main body 110, or as a separate component. In the drawing, a hinge module (not shown) for a folding operation of a swivel body 120 may be inserted in one of internal spaces 131 and 132 of the fixed body 13.

An upper surface of the fixed body 13 may be formed as a plane. A pair of Hall sensors (e.g., Hall ICs) are installed on the plane at a predetermined interval therebetween. The first and second Hall sensors 133 and 134 may be electrically connected to a main board (not shown) within the main body 110 through predetermined cables 135 passing through a hollow portion of the fixed body 13.

The rotary body 15 includes a hollow center shaft 151 rotating with its portion passing through the fixed body 13, and guide pieces 152 and 153 respectively extending from both sides of the center shaft 151. Fixed portions 154 and 155 protrude upwardly from the respective guide pieces 152 and 153, and are fixed to the swivel body 120 by, for example, screws. As illustrated in FIG. 3, a hinge cam, a hinge shaft, and a hinge spring are sequentially received in a hollow portion of the center shaft 151. The hinge cam, the hinge shaft, and the hinge spring serve to provide a feeling of rotation so that a user can stop rotation of the swivel body 120 at, for example, 90° or 180°.

Magnets 156 and 157 having a predetermined magnetic force are installed under the respective guide pieces 152 and 153. The magnets 156 and 157 are installed at positions corresponding to the respective Hall sensors 133 and 134, so that Hall sensors 133 and 134 can selectively detect the magnetic force of the first and second magnets 156 and 157 according to the rotation of the rotary body 15. If there is enough installation space, a magnet lead switch may be used instead of the Hall sensor.

According to the present invention, the pair of magnets 156 and 157, or the pair of Hall sensors 133 and 134 are installed at slightly different positions, so that the first and second Hall sensors 133 and 134 perform or stop detection of the first and second magnets 156 and 157 at different points of time (i.e., with a time difference therebetween) according to the rotation of the rotary body 15 rotating together with the swivel body 120. The rotation direction in which the swivel body 120 rotates can be detected on the basis of the time difference of a change in magnet detecting states of the first and second Hall sensors 133 and 134.

FIGS. 5A through 5E illustrate detection operations of the device for detecting a rotation direction of the rotary body 15 shown in FIG. 3, according to the present invention.

Although the first and second Hall sensors 133 and 134 are installed at the fixed body 13, and the first and second magnets 156 and 157 are installed at the rotary body 15 in the present invention, the first and second Hall sensors 133 and 134 may be installed at the rotary body 15, and the first and second magnets 156 and 157 may be installed at the fixed body 13. Also, although the two Hall sensors 133 and 134 are installed at the very center of the fixed body 13, and the two magnets 156 and 157 are installed off center at predetermined positions with respect to the respective Hall sensors 133 and 134 in the present invention, the magnets 156 and 157 may be placed at the very center, and the Hall sensors 133 and 134 may be installed off center at predetermined positions with respect to the magnets 156 and 157.

Operational relations are described by using only the fixed body 13 and the rotary body 15 illustrated in FIGS. 5A-5E. However, since the fixed body 13 moves together with the main body, and the rotary body 15 moves together with the swivel body, it is clear that the operation of the rotary body 15 and the fixed body 13 corresponds to rotation of the swivel body with respect to the main body.

Figure 5A:
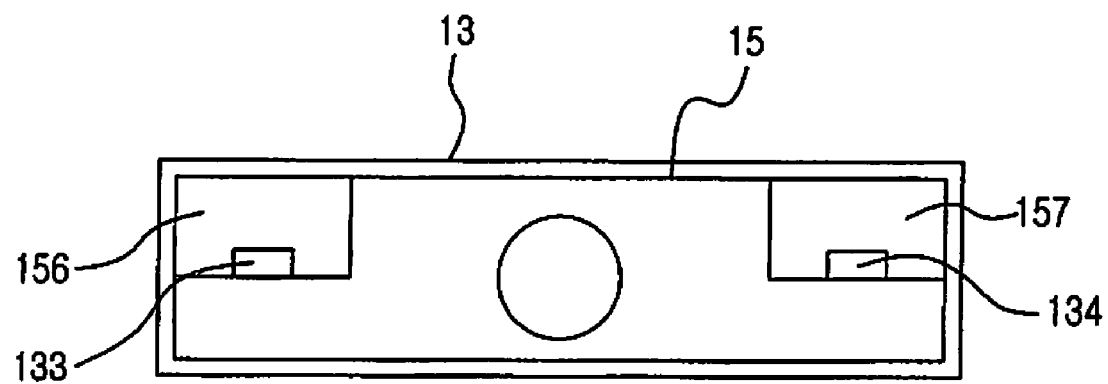
FIGS. 5A through 5E illustrate detecting states of the device for detecting a rotation direction of FIG. 3 depending on rotation of a rotary body according to the present invention.
Figure 5B:
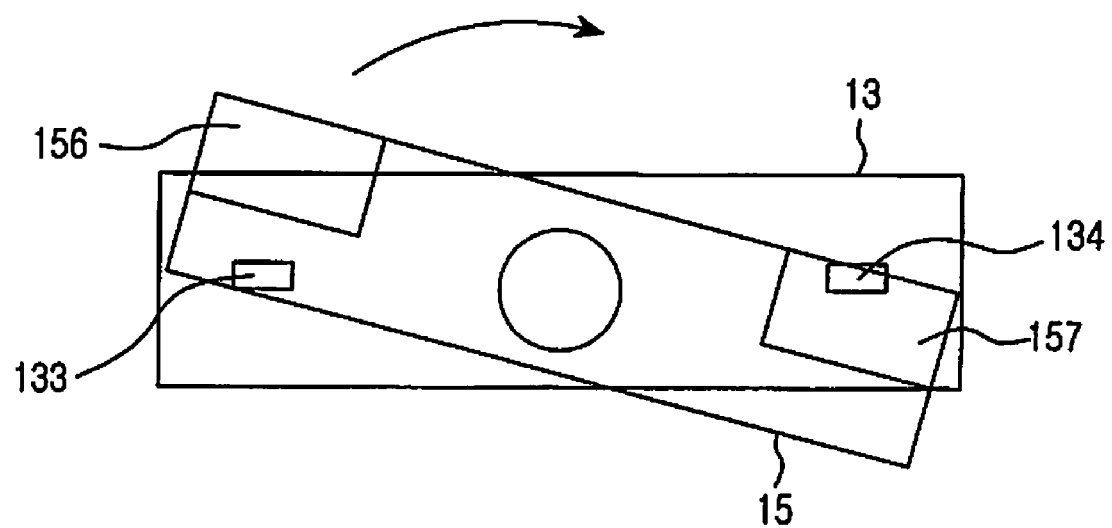
Figure 5C:
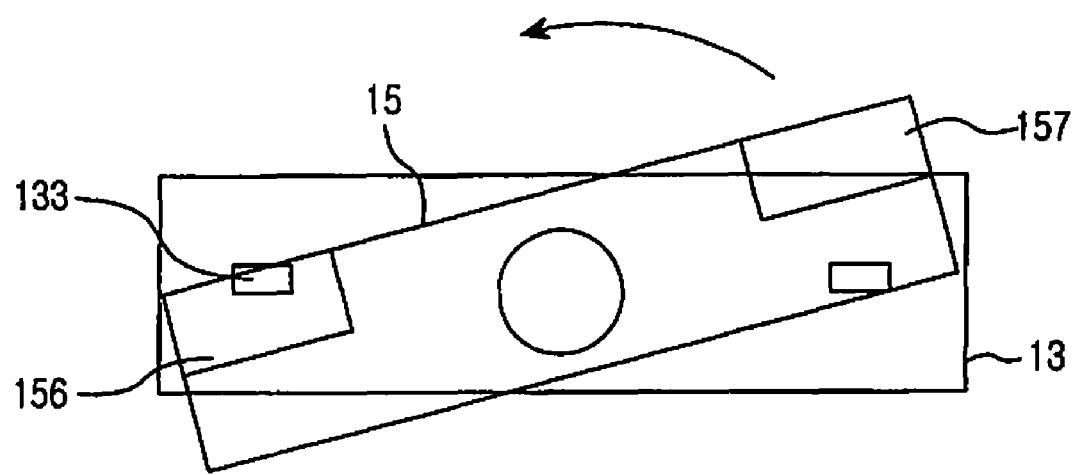
Figure 5D:
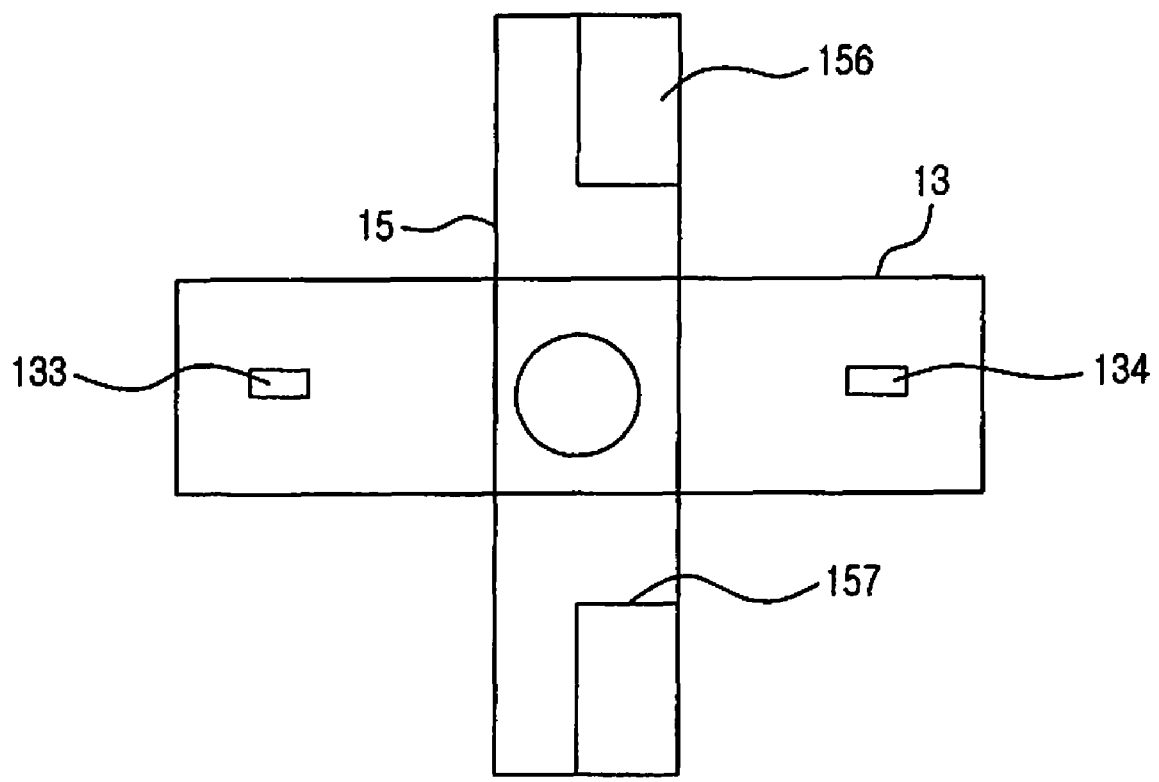
Figure 5E:
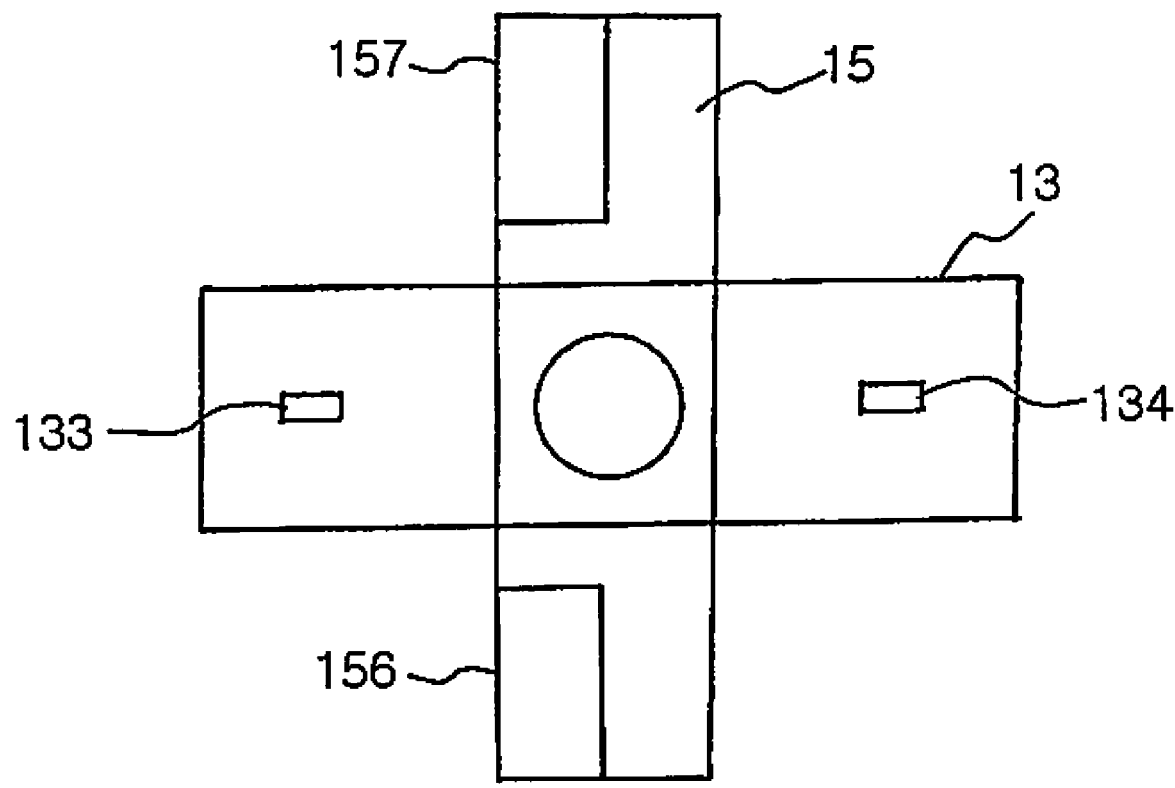

FIG. 5A illustrates an initial state where the rotary body 15 on the fixed body 13 does not rotate. FIG. 5B illustrates a state at the point when the rotary body 15 begins to rotate clockwise from the initial state, and FIG. 5C illustrates a state at the point when the rotary body 15 begins to rotate counterclockwise from the initial state. FIG. 5D illustrates a state when the rotary body 15 has rotated 90° clockwise from the initial state, and FIG. 5E illustrates a state when the rotary body 15 has rotated 90° counterclockwise from the initial state Table 1 below shows detection states of first and second Hall sensors 133 and 134 (Hall IC 1 and Hall IC 2) according to rotated positions of the rotary body 15 rotating clockwise around the fixed body 13.

Referring to Table 1 below, and FIGS. 5A, 5B, and 5D, in the initial state, where the rotary body 15 does not rotate, the first and second Hall sensors 133 and 134 detect the magnets 156 and 157, and maintain low (L) states. However, as illustrated in FIG. 5B, at the point when the rotary body 15 begins to rotate clockwise from the initial state, the first Hall sensor 133 converts an L signal into a high (H) signal. Here, even if the first Hall sensor 133 converts the L signal into the H signal, the second Hall sensor 134 continuously maintains the L state until the rotary body 15 further rotates. That is, when the rotary body 15 rotates clockwise, a magnet detecting state of the first Hall sensor 133 is changed first before the second Hall sensor 134, and then a magnet detecting state of the second Hall sensor 134 is changed. Thus, a terminal control unit can detect clockwise rotation of the swivel body 12 of the terminal by detecting that the magnet detecting state of the first Hall sensor 133 is changed first. Therefore, the terminal control unit can perform control such that functions corresponding to the rotation direction are automatically performed.

When the rotary body 15 has rotated 90° clockwise from the initial state, i.e. when the rotary body 15 is at a rotated position of 90° with reference to an initial 0° position as illustrated in FIG. 5D, both the first and second Hall sensors 133 and 134 generate H signals. Accordingly, the terminal control unit can detect that the rotary body 15 has rotated 90° clockwise from the initial state.

Also, when the rotary body 15 rotates back to the initial position (0°) from the clockwise rotation position of 90°, the second Hall sensor 134 generates an L signal first at the point when the rotary body 15 returns to the 0° position. Of course, when the rotary body 15 rotates further 90° clockwise from the clockwise rotated position of 90°, that is, when the rotary body 15 rotates total 180° from the initial position, the first Hall sensor 133 generates an L signal first. Since the terminal control unit stores the state that the rotary body 15 has rotated 90° clockwise, when the first Hall sensor 133 shows a change in a magnet detecting state first, the terminal control unit can detect that the rotary body 15 rotates 180° clockwise from the initial position. Also, when the second Hall sensor 134 shows a change in a magnet detecting state first, the terminal control unit can detect that the rotary body 15 returns to the initial position.

In Tables 1 and 2, a Hall sensor that shows a change in a magnet detecting state first according to positions of the rotary body is indicated by a dot (●).

TABLE 1

| | Rotation direction Clockwise (cw) | | | | | |
|---|---|---|---|---|---|---|
| Rotation angle | Start cw 0° | cw from 0° | 90° cw | Return to 0° from 90° cw | Rotate from 90° cw to 180° cw | 180° cw |
| Hall IC 1 (sensor 133) | L | H● | H | H | L● | L |
| Hall IC 2 (sensor 134) | L | L | H | L● | H | L |

Table 2 below shows magnet detecting states of the first and second Hall sensors 133 and 134 according to positions of the rotary body 15 rotating counterclockwise with respect to the fixed body 13.

Referring to Table 2 below, and FIGS. 5A, 5C, and 5E, in an initial state where the rotary body 15 does not rotate, the Hall sensors 133 and 134 detect the first and second magnets 156 and 157, and maintain an L state. However, as illustrated in FIG. 5C, when the rotary body 15 rotates counterclockwise, the second Hall sensor 134 converts a signal to an H signal at the point when the rotary body 15 begins to rotate. Even if the second Hall sensor 134 converts the signal to the H signal, the first Hall sensor 133 continuously maintains the L state until the rotary body 15 further rotates. That is, when the rotary body 15 rotated counterclockwise, the magnet detecting state of the second Hall sensor 134 is changed first before the first Hall sensor 133, and then the magnet detecting state of the first Hall sensor 133 is changed. The terminal control unit can detect counterclockwise rotation of the swivel body 120 of the terminal by detecting that the magnet detecting state of the second Hall sensor 134 is changed first. In this manner, the terminal control unit can perform control such that functions corresponding to the rotation direction thereof can be automatically performed.

When the rotary body 15 is placed at a rotated position of 90° with respect to the fixed body 13 as illustrated in FIG. 5E, both the first and second Hall sensors 133 and 134 generate H signals. Accordingly, the terminal control unit can detect that the rotary body 15 has rotated 90° counterclockwise.

Also, when the rotary body 15 rotates back to the initial 0° position from the rotated position of 90°, the first Hall sensor 133 shows a change in the magnet detecting state first, and generates an L signal at the point when the rotary body 15 returns to the 0° position. Of course, when the rotary body 15 rotates further 90° from the rotated position of 90°, that is, total 180°, the second Hall sensor 134 shows a change in the magnet detecting state first at the point when the rotary body 15 almost reaches a rotated position of 180°, and generates an L signal. Since the terminal control unit stores the state that the rotary body 15 has rotated 90° counterclockwise, when the second Hall sensor 134 shows a change in the magnet detecting state first, the terminal control unit can detect that the rotary body 15 is rotated 180°. Also, when the first Hall sensor 133 shows a change in the magnet detecting state first, the terminal control unit can detect that the rotary body 15 returns to the 0° position.

TABLE 2

| Rotation angle | 0° | Start ccw from 0° | 90° ccw | Return to 0° from 90° ccw | Rotate from 90°ccw to 180°ccw | 180° ccw |
|---|---|---|---|---|---|---|
| Hall IC 1 (sensor 133) | L | L | H | L• | H | L |
| Hall IC 2 (sensor 134) | L | H• | H | H | L• | L |

In the present invention, the detection time points of first and second Hall sensors 133 and 134 are set to be different by changing the installation positions of the first and second magnets 156 and 157 and the first and second Hall sensors 133 and 134. However, the above-construction may be implemented by using different-sized magnets or differently setting positions of the Hall sensors.

According to the present invention, the swivel terminal can automatically detect a rotation direction of a swivel body by using a relatively simple and low-cost sensing unit, so that functions corresponding to rotation directions can be set to the terminal in advance, thereby improving convenience in use.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A swivel portable terminal comprising:
   a main body including a predetermined fixed body;
   a swivel body rotatably coupled to the fixed body and including a predetermined rotary body;
   a pair of magnets installed at the rotary body, the magnets having a predetermined interval therebetween;
   a pair of magnet detecting units installed at the fixed body, the magnet detecting units corresponding to the respective magnets; and
   a control unit receiving signals detected by the magnet detecting units according to rotation of the swivel body to determine a rotation direction in which the swivel body rotates, and controlling a function of the terminal corresponding to the determined rotation direction,
   wherein the magnets are installed off-center with respect to the pair of magnet detecting units.

2. The swivel portable terminal of claim 1, wherein the rotary body comprises:
   a hollow center shaft including a space for receiving a swivel hinge module; and
   a plurality of guide pieces respectively extending from both ends of the center shaft to predetermined lengths, and fixed to the swivel body,
   wherein the magnets are respectively installed at the guide pieces to face the fixed body.

3. The swivel portable terminal of claim 2, wherein the magnet detecting units are installed on a plane portion of the fixed body and correspond to the respective magnets.

4. The swivel portable terminal of claim 3, wherein the magnet detecting units are installed such that both the magnet detecting units detect or do not detect the respective magnets simultaneously when the swivel body is not rotating.

5. The swivel portable terminal of claim 4, wherein the magnet detecting units are installed such that the magnet detecting units perform or stop detection of the magnets with a predetermined time difference between the magnet detecting units when the swivel body begins and stops rotating.

6. The swivel portable terminal of claim 5, wherein the control unit receives signals informing the control unit which of magnet detecting units first detects a change in a state of the magnets, and determines the rotation direction of the swivel body according to the change.

7. The swivel portable terminal of claim 1, wherein the magnet detecting units are one of a Hall sensor and a magnetic lead switch.

8. A method for detecting a rotation direction in which a swivel portable terminal having a main body and a swivel body, the swivel portable terminal configured to allow a first and a second magnet detecting units installed at a fixed body of the main body at a predetermined interval between the magnet detecting units to detect a first and a second magnets installed at a rotary body of the swivel body, the first and second magnets corresponding to the first and second magnet detecting units, the method comprising the step of:
   determining a rotation direction in which the swivel body rotates according to a time difference of a change in a magnet detecting state of the first and second magnet detecting units when the swivel body rotates, the magnet detecting state being changed according to a change in relative positions of the first and second magnets with respect to the first and second magnet detecting units,
   wherein the magnets are installed off-center with respect to the pair of magnet detecting units.

9. The method of claim 8, wherein when the swivel body is at an initial position, both the first and second magnet detecting units detect the respective magnets.

10. The method of claim 9, wherein at the point when the swivel body begins to rotate in a first rotation direction, the first magnet detecting unit stops detection of the magnet first before the second magnet detecting unit, thereby determining the first rotation direction.

11. The method of claim 10, wherein at the point when the swivel body begins to rotate in a second rotation direction opposite the first rotation direction, the second magnet detecting unit stops detection of the magnet first before the first magnet detecting unit, thereby determining the second rotation direction.

12. The method of claim 8, wherein the swivel body is installed to be rotatable 90° and 180° about the main body in one of a clockwise direction and a counterclockwise direction.

13. The method of claim 12, wherein when the swivel body has rotated 90°, both the first and second magnet detecting units do not detect the magnets.

14. The method of claim 13, wherein when the swivel body returns to an initial 0° position from a rotated position of 90°, a direction in which the swivel body has rotated from the initial 0° position determines which of the first and second magnet detection sensors performs detection first.

15. The method of claim 13, wherein when the swivel body rotates further 90° from a rotated position of 90° in the same rotation direction, that is, total 180° from an initial 0° position, a direction in which the swivel body has rotated from the initial 0° position determines which of the first and second magnet detection sensors performs detection first.

16. The method of claim 8, wherein the magnet detecting units are one of a Hall sensor and a magnetic lead switch.

17. The swivel portable terminal of claim 1, wherein the magnets are installed under respective guide pieces that respectively extend from both sides of a center shaft of a rotary body of the terminal.

18. The method of claim 8, wherein the magnets are installed under respective guide pieces that respectively extend from both sides of a center shaft of a rotary body of the terminal.

* * * * *